(12) United States Patent
Obara et al.

(10) Patent No.: US 7,557,383 B2
(45) Date of Patent: Jul. 7, 2009

(54) LIGHTING APPARATUS

(75) Inventors: Kunihiko Obara, Kagoshima (JP); Koji Nakatsu, Kagoshima (JP); Hiromi Kitahara, Kagoshima (JP); Toshihide Maeda, Kagoshima (JP); Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 278 days.

(21) Appl. No.: 10/571,856

(22) PCT Filed: Sep. 21, 2004

(86) PCT No.: PCT/JP2004/014124

§ 371 (c)(1),
(2), (4) Date: Mar. 13, 2006

(87) PCT Pub. No.: WO2005/029597

PCT Pub. Date: Mar. 31, 2005

(65) Prior Publication Data

US 2007/0097684 A1   May 3, 2007

(30) Foreign Application Priority Data

Sep. 19, 2003   (JP)   ............... 2003-327807

(51) Int. Cl.
*H01L 33/00* (2006.01)
(52) U.S. Cl. ................ 257/98; 257/99; 257/100
(58) Field of Classification Search ........ 257/98, 257/99, 100
See application file for complete search history.

(56) References Cited

U.S. PATENT DOCUMENTS

| 6,301,035 B1 | 10/2001 | Schairer |
| 6,412,971 B1 | 7/2002 | Wojnarowski et al. |
| 6,641,282 B2 * | 11/2003 | Perlo et al. .................. 362/217 |
| 7,259,403 B2 * | 8/2007 | Shimizu et al. .............. 257/99 |
| 2002/0080615 A1 | 6/2002 | Marshall et al. |
| 2003/0189830 A1* | 10/2003 | Sugimoto et al. ........... 362/294 |
| 2006/0124835 A1* | 6/2006 | Kiyomoto et al. .......... 250/216 |

FOREIGN PATENT DOCUMENTS

| JP | 59-93159 | 6/1984 |
| JP | 63-4010 | 1/1988 |
| JP | 1-160864 | 11/1989 |
| JP | 5-33185 | 4/1993 |
| JP | 10-254388 | 9/1998 |
| JP | 2000-77722 | 3/2000 |
| JP | 2002-057374 | 2/2002 |
| JP | 2003-152225 | 5/2003 |

* cited by examiner

*Primary Examiner*—Shouxiang Hu
(74) *Attorney, Agent, or Firm*—Wenderoth, Lind & Ponack, L.L.P.

(57) ABSTRACT

A lighting apparatus of the present invention comprises: a substrate; a semiconductor light emitting device mounted on the substrate; a resin layer formed on a mounting surface of the substrate and having a lens portion that seals the semiconductor light emitting device; and a reflecting plate. Here, the reflecting plate and the resin layer are positioned with a space therebetween. Herewith, it is possible to offer a lighting apparatus which (i) has high luminance, (ii) causes sufficient heat release, and (iii) is less likely to cause detachment of the resin layer.

16 Claims, 7 Drawing Sheets

LIGHTING APPARATUS

TECHNICAL FIELD

The present invention relates to a lighting apparatus having semiconductor light emitting devices arranged on the substrate.

BACKGROUND ART

In recent years, along with an increase in luminance of semiconductor light emitting devices, use of semiconductor light emitting devices as a light source of a lighting apparatus has been examined.

For example, as shown in FIG. 1, a lighting apparatus 100 disclosed in Japanese Laid-Open Patent Application Publication H09-288460 (hereinafter, referred to as the "lighting apparatus of Conventional Example 1") is formed by mounting a plurality of round semiconductor light emitting devices 102 in a matrix on a control body 101. Individual semiconductor light emitting devices 102 are all together supported by a rubber support 105 having a plurality of through-holes 104 into which lens portions 103 are inserted.

In addition, as shown in FIG. 2, a lighting apparatus 110 disclosed in Japanese Laid-Open Patent Application Publication 2002-299694 (hereinafter, referred to as the "lighting apparatus of Conventional Example 2") is formed by mounting a plurality of semiconductor light emitting devices 112 in a matrix on a metal substrate 111 and covering a mounting surface 113 of the substrate 111 with a resin layer 114 to thereby seal the semiconductor light emitting devices 112. Here, the mounting surface 113 is coated with a high reflectance material.

Furthermore, as shown in FIG. 3, a lighting apparatus 120 disclosed in Japanese Laid-Open Patent Application Publication H11-340517 (hereinafter, referred to as the "lighting apparatus of Conventional Example 3") has a reflective member 123 on which a reflecting surface 122 for guiding, in a direction of drawing out the chief ray, light emitted from a semiconductor light emitting device 121 is formed. The semiconductor light emitting device 121 and reflective member 123 are individually attached to a mounting surface 125 of a substrate 124, and sealed by a resin layer 126 covering the mounting surface 125.

However, the lighting apparatuses 100, 110 and 120 above have various problems in terms of luminance, heat release characteristics, detachment of the resin layer and so on.

That is, as to the lighting apparatus 100 of Conventional Example 1, the luminance is insufficient since part of each lens portion 103 is covered by the rubber support 105, which intercepts light emitted from a light emitting element (not shown). In addition, although the rubber support 105 fitted firmly to the lens portions 103 serves as a heat-releasing member, the heat release effect is not as sufficient as a metal support, because it is made of rubber.

Since the lighting apparatus 110 of Conventional Example 2 does not have a reflecting plate, light emitted in parallel to the mounting surface 113 cannot efficiently be guided in a direction of drawing out the chief ray, which results in insufficient luminance.

The lighting apparatus 120 of Conventional Example 3 cannot efficiently release heat generated in the semiconductor light emitting device 121 because the space between the semiconductor light emitting device 121 and the reflective member 123 is entirely filled with resin. In addition, due to difference in coefficient of thermal expansion, the resin layer 126 is likely to be detached from the reflective member 123 and the substrate 124. On top of this, a contact area between the resin layer 126 and substrate 124 is small due to the presence of the reflective member 123. Therefore, the adhesion between the resin layer 126 and substrate 124 is reduced, which makes the detachment occur more readily.

The present invention has been made in view of the above-stated problems, and aims at offering a lighting apparatus which (i) has high luminance, (ii) causes sufficient heat release, and (iii) is less likely to cause the detachment of the resin layer.

DISCLOSURE OF THE INVENTION

In order to accomplish the above object, the lighting apparatus of the present invention is a lighting apparatus comprising: a substrate; a semiconductor light emitting device mounted on the substrate; a resin layer formed on a mounting surface of the substrate and having a lens portion that seals the semiconductor light emitting device; and a reflecting plate. Here, a space is disposed between the reflecting plate and the resin layer. Thus, providing space between the resin layer and the reflecting plate allows to expose parts conventionally filled with resin to air, which leads to a larger area coming in contact with air and an improved heat release effect.

In addition, the substrate and the resin layer are directly in close contact with each other. Herewith, even if the reflecting plate causes thermal expansion due to heat of the light emitting elements, the adhesion condition between the resin layer and the substrate is not affected by the thermal expansion. Besides, a large contact area between the substrate and the resin layer can be ensured and the adhesion between the substrate and the resin layer is strong. Accordingly, the resin layer is hard to be detached from the substrate.

In the lighting apparatus of the present invention, the semiconductor light emitting device may include a light emitting element. In this case, a distance from a top surface of the substrate to a bottom surface of the reflecting plate is shorter than a distance from the top surface of the substrate to a bottom surface of the light emitting element. According to this structure, light emitted from the light emitting elements in a direction parallel to the mounting surface of the substrate can be reflected by the reflecting plate, which leads to a possible increase in the reflecting efficiency.

In the lighting apparatus of the present invention, the reflecting plate may be attached to at least one of the resin layer and the substrate by a fastening member. According to this structure, even if there is a difference in coefficient of thermal expansion between the reflecting plate and the resin layer, the reflecting plate does not detach itself from the resin layer, unlike in the case of these two being adhered to each other. In addition, the strength of the attachment is high, and it is less likely to cause a misalignment between the reflecting plate and the resin layer even if there is a slight difference in the coefficient of thermal expansion. Furthermore, even when a temporal misalignment is caused at the interface between the reflecting plate and the resin layer due to the thermal expansion, the misalignment would be solved by the function of the fastening member if the reflecting plate and resin layer cool off and return to their original size.

On top of this, in the case when a malfunction of the semiconductor light emitting device occurs, the reflecting plate can be removed and then used in a different lighting apparatus. Additionally, even after the end of the semiconductor light emitting device's life, the reflecting plate can be recycled. Moreover, the reflecting plate can be readily attached to the substrate or the like, as compared to the case of being adhered.

In the lighting apparatus of the present invention, the reflecting plate and the substrate may be thermally connected to each other via the fastening member. According to the structure, heat of the substrate is easily transmitted to the reflecting plate, and therefore the heat release effect by the reflecting plate can be expected. Thus, the lighting apparatus of the present invention achieves further sufficient heat release. In particular, since the reflecting plate directly contacts with ambient air over a large area, a high heat release effect can be expected.

In the lighting apparatus of the present invention, the substrate may have a wiring pattern. Here, the wiring pattern is covered with the resin layer. According to this structure, even if the reflecting plate is made of a conductive material, the wiring does not short-circuit. In addition, there is no need to provide insulation by, for example, establishing an insulating layer between the wiring pattern and the reflecting plate, or burying the wiring pattern in the substrate, and a metal with a high heat release effect can be used as a material for the reflecting plate.

In the lighting apparatus of the present invention, the semiconductor light emitting device may include a light emitting element and a mounting element. Here, the mount element is larger than the light emitting element when viewed in a direction perpendicular to the substrate. According to this structure, light emitted from the light emitting elements toward the substrate can be reflected by the mounting elements, and guided in the direction opposite to the substrate. As a result, the light is less likely to be absorbed by the resin layer on the substrate. Accordingly, an increase in the reflecting efficiency can be expected.

In the lighting apparatus of the present invention, the reflecting plate may be one of (i) a molded piece made of a material selected from the group consisting of metal, ceramic and a mixture thereof and (ii) a molded piece which is made of a single material selected from the group consisting of metal, ceramic and resin, or of a mixture thereof, and to which plating is applied. In this case, the lighting apparatus of the present invention achieves further sufficient heat release, as compared to reflecting plates made of resin.

In the lighting apparatus of the present invention, the reflecting plate may be substantially planar. Here, a surface of the reflecting plate closer to the substrate is in contact with a surface of the resin layer. According to this structure, a large contact area between the reflecting plate and the resin layer can be ensured, and the reflecting plate is less likely to detach itself from the resin layer. At the same time, since heat is easily transmitted to the reflecting plate, the lighting apparatus of the present invention achieves further sufficient heat release. In addition, the reflecting plate is easy to be made as well as high in strength.

In the lighting apparatus of the present invention, the semiconductor light emitting device may include a light emitting element. Here, the substrate has a projecting portion on the mounting surface, and the light emitting element is positioned on the projecting portion. According to this structure, the light emitting elements can be mounted by not bonding them to the mounting elements, but bonding them directly to the substrate.

In the lighting apparatus of the present invention, the reflecting plate may have a hollow space therein. This structure allows a weight reduction of the reflecting plate, which consequently leads to a weight reduction of the lighting apparatus.

BEST MODE FOR CARRYING OUT THE INVENTION

The following gives a description of a lighting apparatus of the present invention, with the aid of drawings.

Embodiment 1

Figure 1:
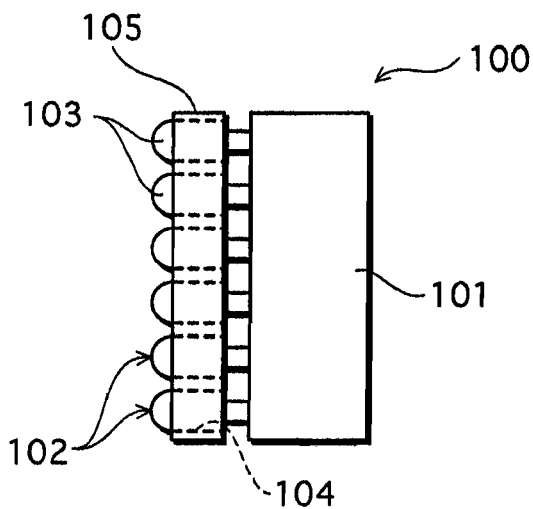
FIG. 1 is a lateral view of a lighting apparatus of Conventional Example 1 discussed in the Background Art section.
Figure 2:
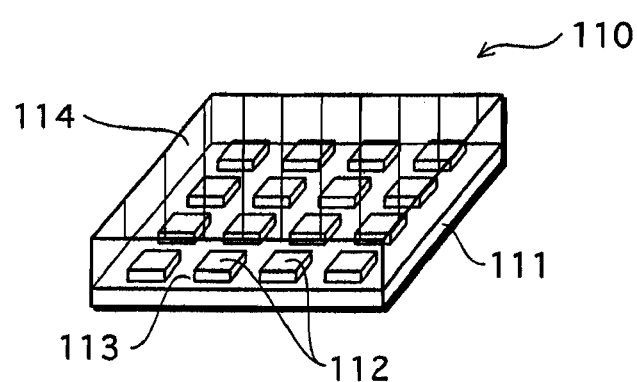
FIG. 2 is a perspective view of a lighting apparatus of Conventional Example 2 discussed in the Background Art section.
Figure 3:
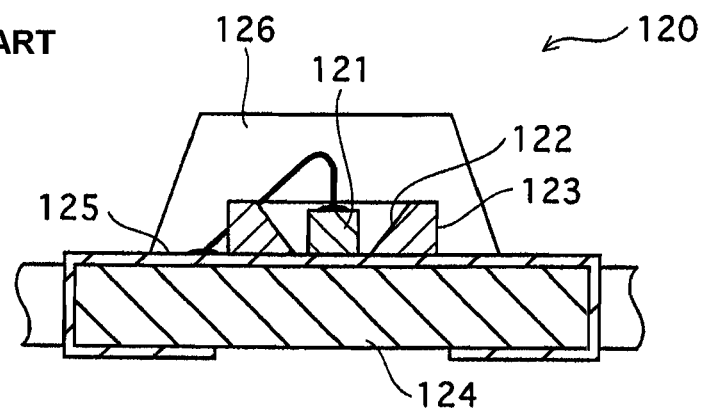
FIG. 3 is a longitudinal sectional view showing part of a lighting apparatus of Conventional Example 3 discussed in the Background Art section.
Figure 4:
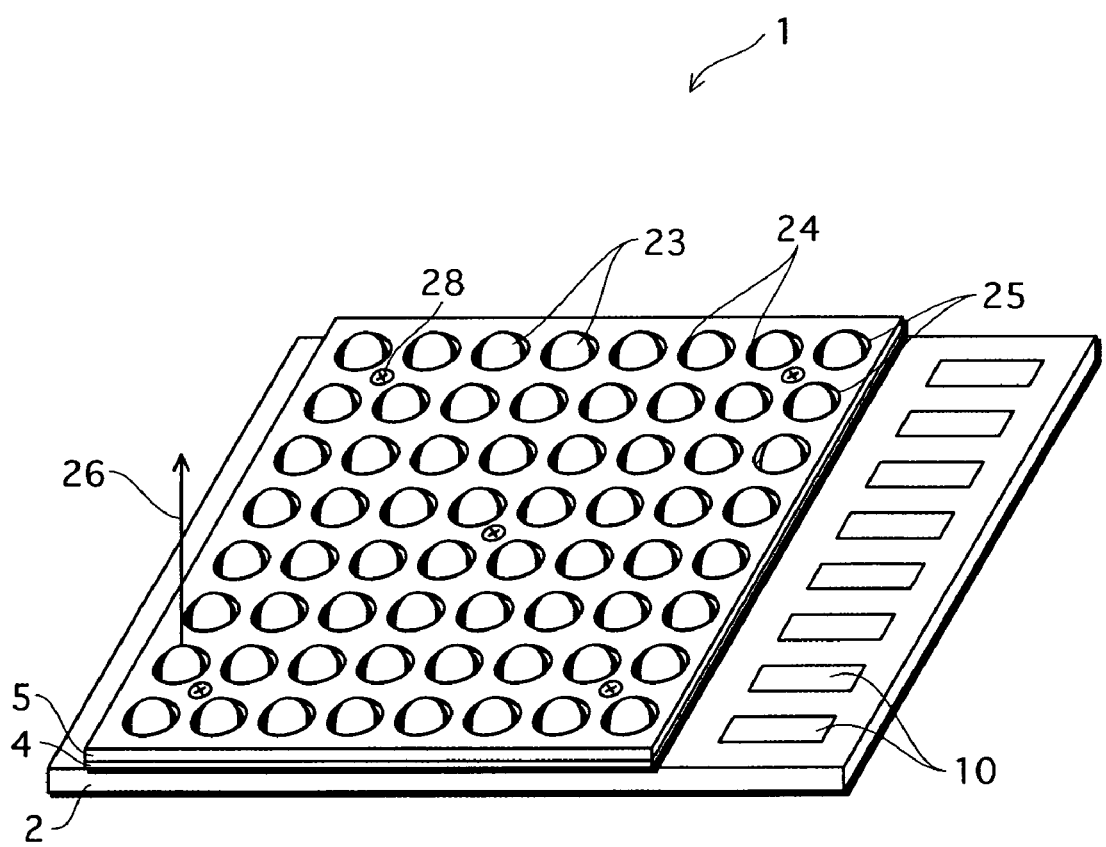
FIG. 4 is a perspective view showing a lighting apparatus of Embodiment 1 according to the present invention.
Figure 5:
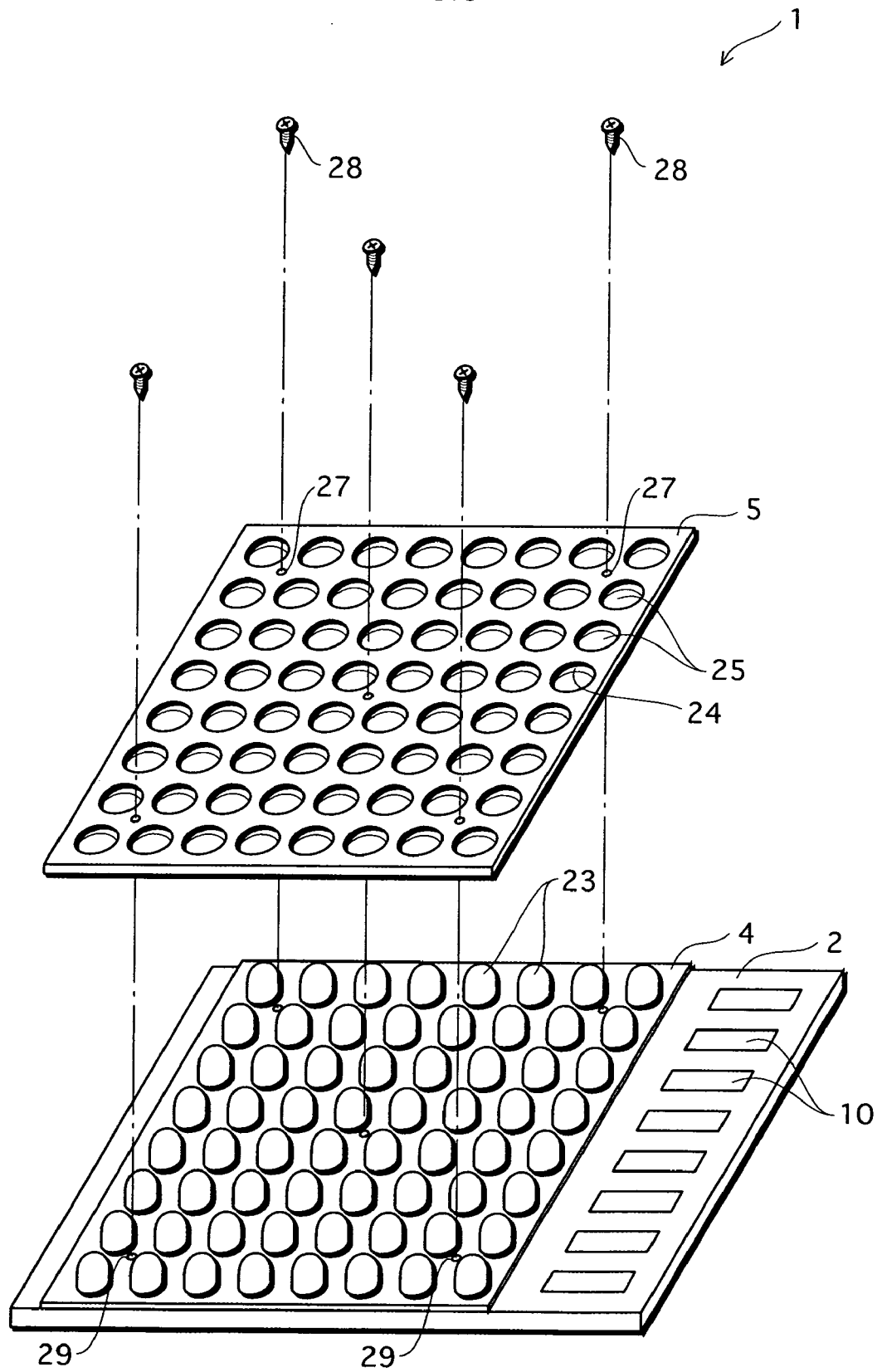
FIG. 5 is a perspective view of the lighting apparatus of Embodiment 1 being disassembled.
Figure 6:
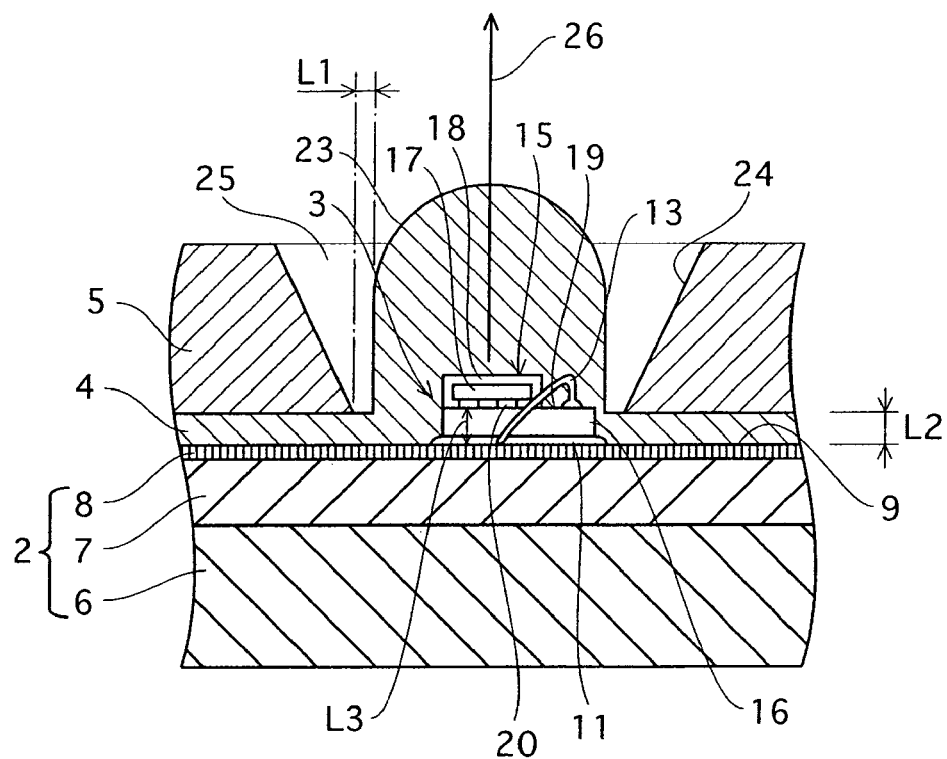
FIG. 6 is a longitudinal sectional view showing the vicinity of a semiconductor light emitting device of the lighting apparatus of Embodiment 1.

FIG. 4 is a perspective view of the lighting apparatus of Embodiment 1 according to the present invention, while FIG. 5 is a perspective view of the lighting apparatus of Embodiment 1 being disassembled. FIG. 6 is a longitudinal sectional view showing the vicinity of a semiconductor light emitting device of the lighting apparatus of Embodiment 1.

A lighting apparatus 1 of Embodiment 1 comprises: a substrate 2; a plurality of semiconductor light emitting devices 3 mounted on the substrate 2; a resin layer 4 formed on the substrate 2 and sealing the semiconductor light emitting devices 3; and a reflecting plate 5 positioned on a surface of the resin layer 4 opposite from the substrate 2, as shown in FIGS. 4 to 6.

The substrate 2 is, as shown in FIGS. 5 and 6, a rectangular plate in which an insulating layer 7, formed from a composite material of a thermosetting resin containing inorganic filler and a resin composition, is positioned on a metal plate 6 made of aluminum, aluminum base alloy (Al+Cu, Al+Mn, Al+Si, Al+Mg, Al+Mg.Si, or Al+Zn.Mg), or copper. Formed on the insulating layer 7 is a mounting surface 9 having a wiring pattern 8 made of copper foil, and the mounting surface 9 is a top surface of the mounting substrate 2. Additionally, formed at one end of the substrate 2 are external terminals 10 for connecting the substrate 2 to a power source.

Figure 7:
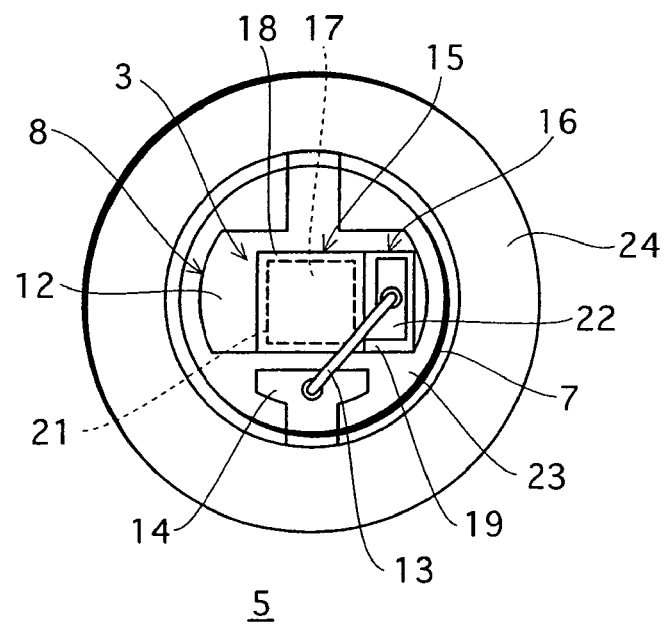
FIG. 7 is a plan view showing the vicinity of the semiconductor light emitting device of the lighting apparatus of Embodiment 1.

FIG. 7 is a plan view showing the vicinity of the semiconductor light emitting device of the lighting apparatus of Embodiment 1. The wiring pattern 8 has: 1st electrodes 12 to which the semiconductor light emitting devices 3 are directly connected by Ag paste 11; and 2nd electrodes 14 to which the semiconductor light emitting devices 3 are connected by Au wires 13, as shown in FIG. 7. Each 1st and 2nd electrodes 12 and 14 are paired, and such paired electrodes are arranged in a matrix on the mounting surface 9 of the substrate 2.

The semiconductor light emitting devices 3 are respectively rectangular in a plan view, and are arranged in a matrix on the mounting surface 9 of the substrate 2 so as to correspond to the paired 1st and 2nd electrodes 12 and 14 of the wiring pattern 8. Note that the semiconductor light emitting devices 3 do not always have to be arranged in a matrix, and may be arranged in a concentric fashion, a radial pattern, or a random manner, for example. Thus, it is possible to obtain a light source having high luminosity and an excellent directional pattern by fitting, on the light emitting surface, a lens enclosing each module.

Each semiconductor light emitting device 3 includes a light emitting element 15 and a mounting element 16.

The light emitting element 15 has: a light emitter 17 which is formed with a high luminance blue light emitter using a GaN compound semiconductor; and a fluorescent layer 18 formed to seal the light emitter 17. Note that the light emitter 17 is not limited to one using a GaN compound semiconductor. In addition, the light emitter 17 is not limited to one formed with a blue light emitter as well, and may be formed with an ultraviolet light emitter.

The fluorescent layer 18 is to make the light emitting element 15 glow white, and is formed from a resin including a phosphor having a characteristic feature that converts blue wavelength light to light in a green-yellow wavelength, which is a complementary color to the blue. Blue light emitted by the light emitter 17 and green-yellow light formed after transmitting through the fluorescent layer 18 are mixed, and thereby the light emitting element 15 appears to glow white. Note that, although the explanation above describes the case where the light emitter 17 emitting blue light is used, the fluorescent layer 18 can be variously changed according to a light emitting color of the light emitter 17. In the case where the light emitter 17 formed with an ultraviolet light emitter is used, for example, the fluorescent layer 18 may include phosphors which are excited by ultraviolet light emitted by the light emitter 17 to thereby emit blue light, red light and green light, and transmit the blue, red and green light converted by the phosphors.

The mounting element 16 is a rectangular plate, and positioned on the mounting surface 9 of the substrate 2. In addition, the mounting element 16 has a thickness of approximately 150 μm in a direction perpendicular to the mounting surface 9, and the surface opposite to the one in contact with the substrate 2 is a mounting surface 19 for mounting the light emitting element 15.

Formed on the mounting surface 19 of the mounting element 16 are, as shown in FIGS. 6 and 7: a rectangular light emitting-element connection area 21 where a projecting Au bump electrode 20 for producing a conducting connection between the 1st electrode 12 of the substrate 2 and the light emitting element 15 is formed; and a rectangular wire connection area 22 connected to the 2nd electrode 14 of the substrate 2 by the Au wires 12. Note that one side of the light emitting-element connection area 21 and one side of the wire connection area 22 are electrically connected at one location.

The mounting element 16 is made from silicon, and forms a zener diode organized by connecting, in parallel, electrodes which have an opposite polarity from the light emitting element 15. Thus, the light emitting element 15 is protected by the zener diode, formed as the mounting element 16, from being damaged by static electricity, and the semiconductor light emitting devices 3 therefore have a high tolerance to noise.

The resin layer 4 is made of epoxy resin, and formed to cover the wiring pattern 8 in the manner that a distance L2 from the mounting surface 9 to the bottom surface of the reflecting plate 5 is 150 to 200 μm. Thus, by setting the distance L2 to 150 to 200 μm, it is possible to effectively reflect light emitted from lateral sides of the light emitting element 15 by the reflecting surface 24. Particularly in the case when the distance L2 is set to 150 μm, the light from the lateral sides is more effectively reflected.

The resin layer 4 and the substrate 2 are directly in close contact with each other. Herewith, isolation between the reflecting plate 5 and wiring pattern 8 can be achieved. In addition, the insulation failure due to entry of moisture and particles from the air does not occur.

Note that a highly pure material, where the addition of filler is reduced or no filler is added, is used for the epoxy resin in order to enhance a light transmission.

As to the resin layer 4, lens portions 23 that seal the semiconductor light emitting devices 3 are formed and arranged in a matrix so as to correspond to the individual semiconductor light emitting devices 3. Each lens portion 23 is substantially semispherical, and positioned in a manner that the center of the light emitting element 15 lies on the optical axis of the lens portion 23.

The reflecting plate 5 is a rectangular plate, and attached to a surface of the resin layer 4 opposite to the substrate 2. That is, the reflecting plate 5 is not sealed by the resin layer 4, and fixed outside the resin layer 4. Accordingly, even if the reflecting plate 5 causes thermal expansion due to heat generated in the light emitting elements 15 when the lighting apparatus 1 is continuously lit up and/or due to heat evolved by an increase in the ambient temperature, the resin layer 4 is not affected and detached from the substrate 2.

In addition, the surface of the reflecting plate 5 closer to the substrate 2 is in contact with the surface of the resin layer 4. As a result, the heat generated in the light emitting elements 15 and conducted to the resin layer 4 via the mounting elements 16 and wiring pattern 8 is readily transmitted to the reflecting plate 5. Note that an adhesive material may be present between the reflecting plate 5 and the resin layer 4.

As shown in FIG. 4, a plurality of through-holes 25 each having the reflecting surface 24 are provided on the reflecting plate 5 in a matrix so as to correspond to the individual semiconductor light emitting devices 3. Each through-hole 25 is round in the horizontal cross section, and formed so that its cross-sectional area increases in a direction of drawing out the chief ray (hereinafter, referred to as "chief-ray drawing out direction") 26—i.e. in a direction perpendicular to the mounting surface 9 of the substrate 2 and away from the substrate 2.

Figure 8:
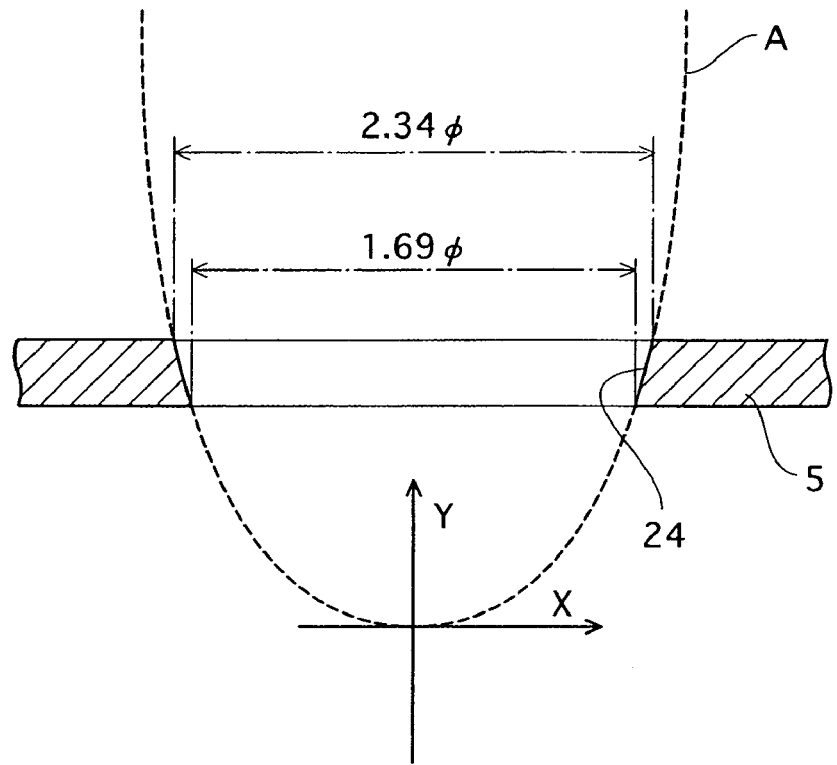
FIG. 8 is a longitudinal sectional view showing a through-hole of a reflecting plate.

FIG. 8 is a longitudinal sectional view showing a through-hole of the reflecting plate. Each through-hole 25 has a smaller aperture diameter of approximately 1.69 mm on the side close to the substrate 2, while having a larger aperture diameter of approximately 2.34 mm on the opposite side away from the substrate 2, as shown in FIG. 8. In addition, the reflecting surface 24 of the through-hole 25 has a shape equal to one created by cutting the reflecting plate 5 in a horizontal position along Curve A, which is expressed by an equation $x^2 = 4 \times f \times y (f=0.48)$, rotating around the Y axis.

Into each through-hole 25, the lens portion 23 of the resin layer 4 is fit so that the center of the through-hole 25 lies on the optical axis of the lens portion 23, as shown in FIG. 6. The through-hole 25 is larger than the lens portion 23, and a distance L1 from the outer rim of the aperture of the through-hole 25 on the side close to the substrate 2 to the outer rim of the base of the lens portion 23 is about 1 mm. That is, there is space between the reflecting plate 5 and the resin layer 4—to be more specific, between the reflecting surface 24 of the reflecting plate 5 and the lens portion 23 of the resin layer 4.

Thus, providing space between the resin layer 4 and the reflecting plate 5 allows to expose parts conventionally filled with resin to air, and as a result, the contact area of the reflecting plate 5 with air increases and the heat release effect is improved. Additionally, even if the reflecting plate 5 causes thermal expansion, the lens portion 23 will not be pressed against the reflecting surface 24 of the reflecting plate 5, which avoids having an impact on optical characteristics of the lens portion 23.

Note that the distance L1 from the base of the lens portion 23 is preferably 0.5 mm or less in order to enhance the reflecting efficiency. In particular, setting it to 0.3 mm or less limits influence on the directional pattern and enables a reduction in variation of chromaticity and brightness according to direction.

The reflecting plate 5 is made of aluminum, and therefore has a high reflecting efficiency and causes sufficient heat release. Note however that the reflecting plate 5 is not limited to an aluminum molded piece, and may be a molded piece made of a single material—for example, a different metal such as stainless or copper, or ceramic or resin. In addition, it may be a molded piece made of a mixture of at least two materials selected from metals—such as aluminum, aluminum base alloy and copper, ceramic, resin and the like. Furthermore, material that gives gloss may be plated or coated on the surface of such a molded piece for yielding a reflection function.

As shown in FIG. 5, a total of five threaded holes 27 are provided on the reflecting plate 5 in the vicinity of the center as well as of the four corners. The reflecting plate 5 is fixed onto the substrate 2 by screws 28 functioning as fastening members with the use of the threaded holes 27.

Figure 9:
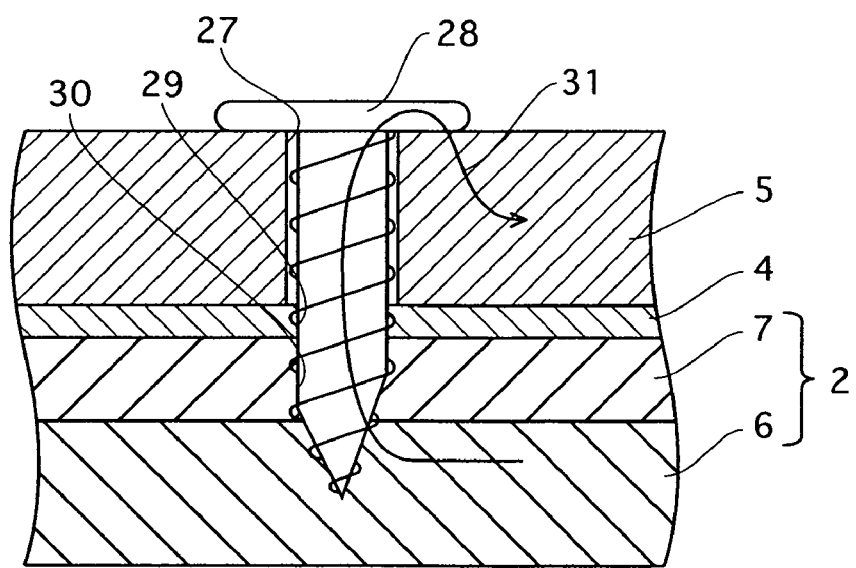
FIG. 9 is a longitudinal sectional view showing a screw lock of the lighting apparatus of Embodiment 1.

FIG. 9 is a longitudinal sectional view showing a screw lock of the lighting apparatus of Embodiment 1. Individual threaded holes 29 and 30, communicating with each other, are provided on the resin layer 4 and substrate 2, respectively, so as to correspond to the threaded hole 27 of the reflecting plate 5, as shown in FIG. 9. The reflecting plate 5 is fixed to the resin layer 4 by twisting the screws 28 into the threaded holes 29 and 30. According to this structure, heat generated in the light emitting elements 15 and conducted through the wiring pattern 8 from the mounting elements 16 is released from the reflecting plate 5 through the screws 28.

By twisting the screws further more, the reflecting plate 5 is fixed onto to the substrate 2. Herewith, the screws 28 reach the metal plate 6. Accordingly, the heat generated in the light emitting element 15 and conducted to the substrate 2 from the mounting element 16 is released from the reflecting plate 5 through the screws 28, and the heat release effect is further enhanced.

The threaded holes 27 of the substrate 2 are formed at parts insulated from the wiring pattern 8 on the mounting surface 9. Therefore, the insulation between the wiring pattern 8 and the reflecting plate 5 is ensured.

The screws 28 are micromini precision screws made of carbon steel, and provide good fastening. The tip end of each screw 28 reaches the metal plate 6 of the substrate 2, and the reflecting plate 5 and the substrate 2 are thermally connected via the screws 28. Therefore, the heat generated in the light emitting elements 15 and conducted to the substrate 2 is partially transmitted to the reflecting plate 5 via the screws 28 as indicated by an arrow 31. Since the reflecting plate 5 has a large area exposed to air, the heat is released from the reflecting plate 5.

Note that the fastening members are not limited to screws, and may be bolts, pins or rivets, for example. In this regard, however, it is desirable that the fastening members be made of a material with good heat conductance, such as metal, in view of the heat release. In addition, the tip ends of the screws 28 do not always have to reach the metal plate 6, and may be twisted into only the resin layer 4. Furthermore, a structure may be adopted in which the diameter of the threaded hole 29 in the resin layer 4 is made larger than that of the screw 28, and the screw 28 is twisted into only the substrate 2.

Next is described a method for manufacturing the lighting apparatus 1 of Embodiment 1 having the above-stated structure.

First, the semiconductor light emitting devices 3 are made by flip-chip mounting the light emitters 17 on the light emitting-element connection areas 21 of the mounting elements 16 forming zener diodes, and subsequently forming the fluorescent layer 18.

Then, the semiconductor light emitting devices 3 are fixed to the individual 1st electrodes 12 of the substrate 2 using the Ag paste 11, and the wire connection areas 22 of the mounting elements 16 and the 2nd electrodes 14 of the substrate 2 are conductively connected to each other by wire bonding using the Au wire 13.

Next, the resin layer 4 is formed, by transfer molding, on the substrate 2 where the semiconductor light emitting devices 3 have been mounted. In the transfer molding, upper and lower molds of a molding for resin molding (not shown) are closed up, and an optically transparent epoxy resin is poured into the inside of the molding, and the resin layer is formed by hardening the resin.

On the other hand, the reflecting plate 5 is made by providing the through-holes 25 and threaded holes 27 in a rectangular aluminum plate with a predetermined size. Specifically speaking, the plate is set in a lathe, and the through-holes 25, each having a circular truncated conical shape, are formed at predefined positions in the plate using a cutting machine, and the threaded holes 27 are perforated in predefined positions using a press machine or a drill.

The reflecting plate 5 is, first, positioned in a manner that the individual lens portions 23 of the resin layer 4 are fit into the through-holes 25 while the threaded holes 27 of the reflecting plate 5 are made to communicate with the threaded holes 29 of the resin layer 4. Then, the reflecting plate 5 is attached by twisting the screws 28 into the threaded holes 27 and 29.

When the lighting apparatus 1 of Embodiment 1 manufactured in the above described manner is used, electric current is supplied to the lighting apparatus 1 through the external terminals 10 of the substrate 2. Then, electric current is supplied to the semiconductor light emitting devices 3 from the 1st and 2nd electrodes 12 and 14 of the wiring pattern 8, and thereby the light emitting elements 15 of the semiconductor light emitting devices 3 emit light.

Part of light emitted from each light emitting element 15 is converged by the lens portion 23 and emitted in the chief-ray drawing out direction 26, which is the direction of the optical axis of the lens portion 23. The rest of the light emitted from the light emitting element 15 is reflected by the reflecting surface 24 of the through-hole 25 and emitted in the chief-ray drawing out direction 26.

As shown in FIG. 6, the distance L2 from the mounting surface 9 of the substrate 2 to the bottom surface of the reflecting plate 5 is 150 to 200 μm, which is shorter than a distance L3 from the mounting surface 9 of the substrate 2 to the bottom surface of the light emitting element 15. Thus, because the distance L2 is shorter than the distance L3, it is possible to effectively reflect light emitted from lateral sides of the light emitting element 15 by the reflecting surface 24. In particular, in the case when the distance L2 is set to 150 μm, the light from the lateral sides is more effectively reflected.

Note that, in order to make the distance L2 from the mounting surface 9 of the substrate 2 to the bottom surface of the reflecting plate 5 shorter than the distance L3 from the mounting surface 9 of the substrate 2 to the bottom surface of the light emitting element 15, it is preferable that the, resin layer 4 have a thickness thinner than the mounting element 16. For example, since the thickness of the resin layer 4 is 150 to 200 μm, as described above, it is desirable to set the thickness of the mounting element 16 to 150 μm or more.

Figure 10:
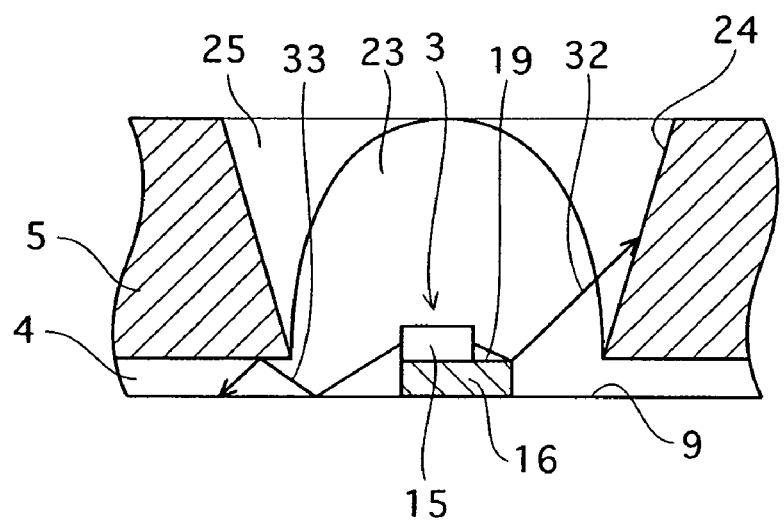
FIG. 10 is a schematic diagram for illustrating light paths of light emitted from a light emitting element.
Figure 11:
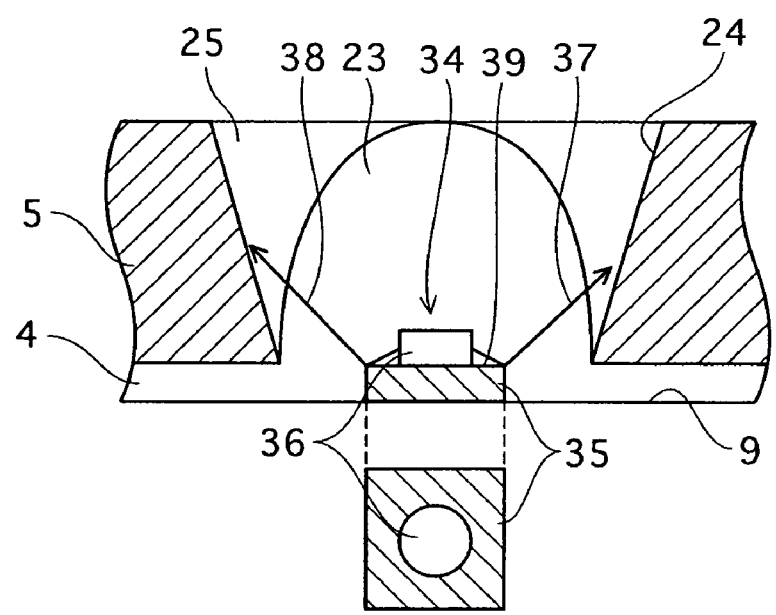
FIG. 11 is another schematic diagram for illustrating light paths of light emitted from a light emitting element.

FIGS. 10 and 11 are schematic diagrams for illustrating light paths of light emitted from the light emitting element. As to the lighting apparatus 1 of Embodiment 1, the size of the semiconductor light emitting device 3 is reduced by making the mounting element 16 small. Accordingly, as shown in FIG. 7, the mounting surface 19 of the mounting element 16 is formed to fit the shape of the light emitting element 15, except for the wire connection area 22.

Therefore, from among light emitted parallel to and toward the mounting surface 9, light reflected by the wire connection area 22 is, as indicated by an arrow 32, further reflected by the reflecting surface 24 and guided in the chief-ray drawing out direction 26, as shown in FIG. 10. On the other hand, light not reflected by the wire connection area 22 does not reach the reflecting surface 24 and is absorbed into the resin layer 4 between the reflecting plate 5 and the substrate 2, as indicated by an arrow 33.

Given this factor, like a semiconductor light emitting device 34 shown in FIG. 11, making a mounting element 35 larger is viewed as a way to further enhance the reflecting efficiency. When the semiconductor light emitting device 34 is viewed in a perpendicular direction to the mounting surface 9 of the substrate 2, the mounting element 35 is larger than the light emitting element 36. According to this structure, the light emitted parallel to and toward the mounting surface 9 can be effectively reflected by a mounting surface 39 of the mounting element 35 and guided in a direction of the reflecting surface 24, as indicated by arrows 37 and 38, and thereby the reflecting efficiency is enhanced.

In this case, it is desirable that, when viewed in a perpendicular direction to the mounting surface 9 of the substrate 2, the mounting surface 39 of the mounting element 35 stretch outward around the entire circumference of the light emitting element 36, as shown in FIG. 11.

Embodiment 2

Next is described a lighting apparatus of Embodiment 2 according to the present invention. Note that the basic structure of the lighting apparatus of Embodiment 2 is the same as that of the lighting apparatus 1 of Embodiment 1, and therefore, components identical to those in Embodiment 1 are given the same reference numerals. The following description focuses on differences of the Embodiment 2 from the Embodiment 1 while the explanation for the identical components is omitted or made in a simple manner.

Figure 12:
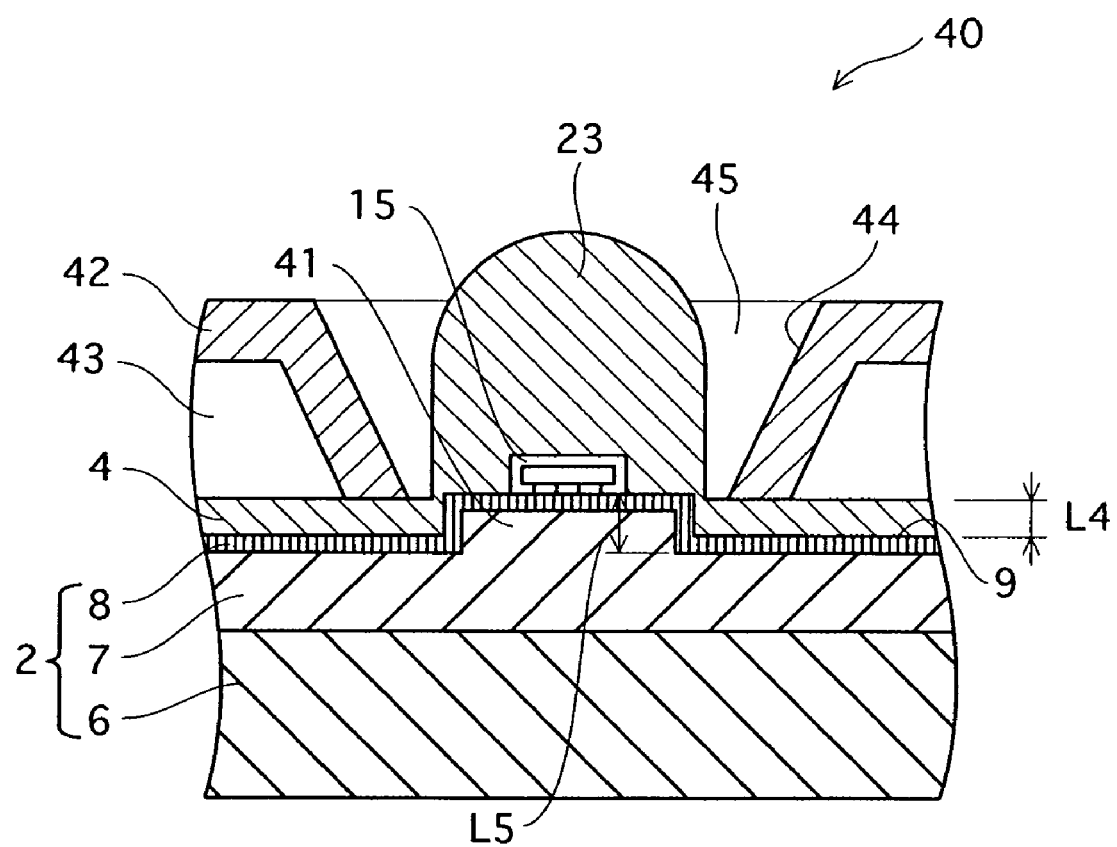
FIG. 12 is a longitudinal sectional view showing part of a lighting apparatus of Embodiment 2.

FIG. 12 is a longitudinal sectional view showing part of the lighting apparatus of Embodiment 2. The substrate 2 of a lighting apparatus 40 of Embodiment 2 has a projecting portion 41 in the mounting surface 9, as shown in FIG. 12. The projecting portion 41 is formed so that part of the top surface of the insulating layer 7 projects in the chief-ray drawing out direction 26. On the projecting portion 41, part of the wiring pattern 8 is formed. The size of the top surface of the projecting portion 41 is set so that the top surface of the projecting portion 41 fits within the lens portion 23 and becomes larger than the bottom surface of the light emitting element 15 of the semiconductor light emitting device 3. The light emitting element 15 is positioned on the projecting portion 41 and directly bonded to the wiring pattern 8 on the projecting portion 41. Thus, the semiconductor light emitting device 3 of Embodiment 2 does not have a member corresponding to the mounting element 16 of Embodiment 1, and the light emitting element 15 is directly mounted on the substrate 2.

A reflecting plate 42 is a rectangular aluminum plate, and attached to a surface of the resin layer 4 opposite to the substrate 2. Note however that the reflecting plate 5 is not limited to an aluminum molded piece, and may be a molded piece made of a single material—for example, a different metal such as stainless or copper, or ceramic or resin. In addition, it may be a molded piece made of a mixture of at least two materials selected from metals—such as aluminum, aluminum base alloy and copper, ceramic, resin and the like. Furthermore, material that gives gloss may be plated or coated on the surface of such a molded piece for yielding a reflection function.

The reflecting plate 42 has hollow sections 43 on its surface close to the substrate 2. And, in the reflecting plate 42, a plurality of through-holes 45, each having a reflecting surface 44, are provided in a matrix so as to correspond to the individual semiconductor light emitting devices 3.

To make the reflecting plate 42, first, concave portions each having a circular truncated conical shape are formed in an aluminum thin plate with a thickness of 0.3 to 0.5 mm, using a press machine. Then, the bottom surfaces of the concave portions are perforated by a press machine or a drill to thereby form the through-holes 45. Note that setting the gradient angle of the reflecting surface 44 of each through-hole 45 to 40° to 60° enables the light leaked from the lens portion 23 to be effectively reflected in the direction of light emission.

In the reflecting plate 42 made in this fashion, parts other than where the through-holes 45 are formed are the hollow sections 43. Screw holes (not shown) provided for fixing the reflecting plate 42 onto the substrate 2 are formed by using a press machine.

When the reflecting plate 42 is attached to the substrate 2, hollows of the hollow sections 43 are formed between the reflecting plate 42 and the substrate 2. Accordingly, the contact area between the reflecting plate 42 and the resin layer 4 can be made small, and the resin layer 4 is less likely to be affected by the thermal expansion of the reflecting plate 42. In addition, the amount of aluminum used can be reduced for the volume of the hollow sections 43, which achieves a weight reduction of the reflecting plate 42.

Besides forming the hollow sections 43 on the surface of the reflecting plate 42 close to the substrate 2 as described above, the weight reduction of the reflecting plate 42 is also feasibly by, for example, forming hollow sections on the opposite side away from the substrate 2. In addition, a structure may be adopted in which through-holes, which fulfill the function of hollow sections, are provided for the purpose of weight reduction, separately from the through-holes 45.

A distance L4 from the mounting surface 9 of the substrate 2 to the bottom surface of the reflecting plate 42 is 150 to 200 μm, and shorter than a distance L5 from the mounting surface 9 of the substrate 2 to the bottom surface of the light emitting element 15, as shown in FIG. 12. Thus, since the distance L4 is shorter than the distance L5, light emitted from the lateral sides of the light emitting element 15 can be effectively reflected by the reflecting surface 44. In particular, when the distance L4 is set to 150 µm, the light can be reflected more effectively.

In order to make the distance L4 from the mounting surface 9 of the substrate 2 to the bottom surface of the reflecting plate 42 shorter than the distance L5 from the mounting surface 9 of the substrate 2 to the bottom surface of the light emitting element 15, it is preferable that the thickness of the resin layer 4 be less than the thickness of the projecting portion 41 in the direction perpendicular to the mounting surface 9. For example, since the thickness of the resin layer 4 is 150 to 200 µm, as described above, the thickness of the projecting portion 41 should preferably be set to 150 µm or more.

The present invention has thus been described based on the preferred embodiments above; however, it is a matter of course that the present invention is not confined to specific examples shown in the above embodiments.

INDUSTRIAL APPLICABILITY

The lighting apparatus of the present invention can be used as a display apparatus. That is, if the semiconductor light emitting devices are integrated with a publicly known lighting control circuit and thereby made to individually light up, characters, symbols and the like can be displayed by the combination of lighting.

The invention claimed is:

1. A lighting apparatus comprising:
a substrate;
a semiconductor light emitting device mounted on the substrate;
a resin layer formed on a mounting surface of the substrate, said resin layer having a bottom portion having a flat surface, a base portion extending from the bottom portion and having a side surface substantially perpendicular to said flat surface, and a lens portion extending from the base portion, said resin layer being configured to seal the semiconductor light emitting device; and
a reflecting plate having a through-hole from an array of through-holes, the through-hole being configured to enable the lens portion to extend therethrough, the though-hole defining a reflecting surface;
wherein the reflecting plate and the lens portion are positioned with a space therebetween such that the reflecting surface is not in contact with base portion and;
wherein the reflecting plate is on and in contact with the flat surface;
wherein the reflecting plate is attached to at least one of the resin layer and the substrate by a fastening member; and
wherein the reflecting plate is a molded piece made of a material selected from the group consisting of metal, ceramic and a mixture thereof, and a plating layer is supplied to a surface of the molded piece.

2. The lighting apparatus of claim 1, wherein
the semiconductor light emitting device includes a light emitting element, and a distance from a top surface of the substrate to a bottom surface of the reflecting plate is shorter than a distance from the top surface of the substrate to a bottom surface of the light emitting element.

3. The lighting apparatus of claim 2, wherein
the reflecting plate and the substrate are thermally connected to each other via the fastening member.

4. The lighting apparatus of claim 2, wherein
the substrate has a wiring pattern, and
the wiring pattern is covered with the resin layer.

5. The lighting apparatus of claim 2, wherein
the reflecting plate has a hollow space therein.

6. The lighting apparatus of claim 1, wherein an edge is formed at an intersection of the reflecting surface and the surface of the reflecting plate closer to the substrate; and the edge is not in contact with the base portion and the lens portion.

7. The lighting apparatus of claim 2, wherein the lens portion is substantially semispherical and is not in contact with any portion of the reflecting surface.

8. The lighting apparatus of claim 1, wherein
the reflecting plate and the substrate are thermally connected to each other via the fastening member.

9. The lighting apparatus of claim 1, wherein
the substrate has a wiring pattern, and
the wiring pattern is covered with the resin layer.

10. The lighting apparatus of claim 1, wherein
the semiconductor light emitting device includes a light emitting element and a mounting element, and
the mount element is larger than the light emitting element when viewed in a direction perpendicular to the substrate.

11. The lighting apparatus of claim 10, wherein
a distance from a top surface of the substrate to a bottom surface of the reflecting plate is shorter than a distance from the top surface of the substrate to a bottom surface of the light emitting element.

12. The lighting apparatus of claim 10, wherein
the reflecting plate has a hollow space therein.

13. The lighting apparatus of claim 1, wherein
the semiconductor light emitting device includes a light emitting element,
the substrate has a projecting portion on the mounting surface, and
the light emitting element is positioned on the projecting portion.

14. The lighting apparatus of claim 13, wherein
the reflecting plate has a hollow space therein.

15. The lighting apparatus of claim 1, wherein
the reflecting plate has a hollow space therein.

16. The lighting apparatus of claim 1, wherein a distance between the reflecting plate and the base portion of the lens portion is 0.5 mm or less.

* * * * *